US007547461B2

(12) United States Patent
Molaire

(10) Patent No.: US 7,547,461 B2
(45) **Date of Patent: *Jun. 16, 2009**

(54) PROCESS FOR PRODUCING ELECTROPHOTOGRAPHIC COMPOSITION LAYER HAVING CONTROLLED THICKNESS BY DIP COATING ON THIN SUBSTRATE

(75) Inventor: Michel F. Molaire, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 843 days.

This patent is subject to a terminal disclaimer.

(21) Appl. No.: 11/021,806

(22) Filed: Dec. 21, 2004

(65) Prior Publication Data

US 2005/0158453 A1 Jul. 21, 2005

Related U.S. Application Data

(60) Provisional application No. 60/533,125, filed on Dec. 24, 2003.

(51) Int. Cl.
*C23C 14/54* (2006.01)
*B05D 1/18* (2006.01)

(52) U.S. Cl. ............................ 427/9; 427/430.1; 427/8

(58) Field of Classification Search ............... 427/8–10, 427/430.1
See application file for complete search history.

(56) References Cited

U.S. PATENT DOCUMENTS 4,618,559 A 10/1986 Yashiki
6,270,850 B1 8/2001 Cai et al.

OTHER PUBLICATIONS

Denshi Shashin Gakkai-shi "Electrophotography", vol. 28, No. 2, (1989) pp. 54-63 (186-195).
P. Groenveld, "Thickness Distribution in Dip-Coating", J. Paint Technology, V ol. 43, No. 561, Oct. 1971.

*Primary Examiner*—Timothy H Meeks
*Assistant Examiner*—David Turocy
(74) *Attorney, Agent, or Firm*—Lawrence P. Kessler; Andrew J. Anderson

(57) ABSTRACT

A method for controlling the thickness and uniformity of a dip coated layer, using a coating apparatus under conditions of controlled temperature and controlled low humidity, includes the following steps: under normal coating conditions of ambient temperature and relative humidity, forming on a metal substrate having a thickness of at least about 500 microns a series of coated layers using variations in coating solution viscosity m, coating substrate withdrawal speed v, capillary number Ca, coating solution surface tension S, and boiling point bp (a correlative of evaporation rate) of the coating solution solvent, a coated layer including at least a portion of uniform thickness T(even) and, optionally, a portion of non-uniform thickness L(uneven); statistically analyzing measurements carried out on the series of coated layers and generating the constants, a, b, c, d, and e for Equations 2, 3, and 4:

$$T(\text{even})=a+b(m*v) \quad \text{(Equation 2)}$$

$$L(\text{uneven})=c+d*(v*bp)+e*(Ca*bp) \quad \text{(Equation 3)}$$

$$v(\text{even})=-c/bp*(d+e*m/S) \quad \text{(Equation 4)}$$

using Equation 4, determining the coating speed v(even) producing the maximum thickness of a coated layer having a completely uniform thickness for a given set of coating solution characteristics, the coated layer being formed on a thin substrate under coating conditions of controlled temperature and controlled low humidity; and using Equation 2, determining the thickness T(even) of the portion of the coated layer having uniform thickness for a given set of coating solution characteristics and the coating speed determined in step (c), the coated layer being formed on a thin substrate under coating conditions of controlled temperature and controlled low humidity.

22 Claims, 1 Drawing Sheet

PROCESS FOR PRODUCING ELECTROPHOTOGRAPHIC COMPOSITION LAYER HAVING CONTROLLED THICKNESS BY DIP COATING ON THIN SUBSTRATE

CROSS-REFERENCE TO RELATED APPLICATION

Reference is made to the co-pending, commonly assigned, U.S. Provisional Patent Application Ser. No. 60/533,125 filed on Dec. 24, 2003, entitled: DIP COATING PROCESS FOR PRODUCING ELECTROPHOTOGRAPHIC COMPOSITION LAYER HAVING CONTROLLED THICKNESS, the disclosure of which is incorporated herein by reference.

FIELD OF THE INVENTION

The present invention relates to the coating of photoconductor substrates and, more particularly, to a method for controlling the thickness uniformity of a layer applied by dip coating under controlled temperature and humidity conditions to a thin substrate.

BACKGROUND OF THE INVENTION

Although dip coating is widely used and is the preferred method for manufacturing photoconductor drums, not much has been published on the subject. A review paper by M. Aizawa in Denshi *Shashin Gakkai-shi* (*Electrophotography*), Vol. 2, No. 9, pp. 54-63 (186-195) reports that the formation of the coating film is influenced by the coating environment (temperature, humidity, and cleanliness) as well as by removal of bubbles from the coating solution, turbulence of the coating process, homogeneity of the drum surface (interfacial tension between surface and coating liquid), and other factors.

A critical issue in dip coating for the manufacture of photoconductor drums is the control of both thickness and thickness uniformity, especially for high quality printing. U.S. Pat. No. 4,618,559, the disclosure of which is incorporated herein by reference, describes the impact of this problem on the uniformity of photosensitivity of the coated drum. Thickness non-uniformity of the charge transport layer results in non-uniform photosensitivity. To deal with the problem, the reference describes an improved process for preparing an electrophotographic photosensitive member having a charge generation layer on a substrate and a charge transport layer, each formed by dip-coating, wherein the charge transport layer forms a predetermined irregular end film portion of length H that impairs the photosensitivity of the member. The improvement in the process entails controlling the thickness of the charge generation layer over the end film portion H by varying the withdrawal rate of the substrate during the dip coating of the charge generation layer in accordance with a specified formula.

U.S. Pat. No. 6,270,850, the disclosure of which is incorporated herein by reference, describes a method for improving the quality of a dip coated layer that is deposited by flowing a solution along a substrate in a gap between the substrate and a wall, including: (a) determining a yield stress, a viscosity, a density, and a surface tension of the solution, and selecting a wet thickness of the coated layer; (b) determining a coating speed based on the determined viscosity, the determined density, the determined surface tension of the solution, and the selected wet layer thickness; and (c) selecting a distance for the gap and calculating the shear stress of the solution in the gap based on the gap distance, wherein the shear stress is greater than the yield stress.

U.S. Pat. No. 6,270,850 discusses coating non-uniformities such as streaking, marbling and sloping, i.e., a top to bottom thickness difference on a drum and suggests that some of most of these defects are caused by non-Newtonian coating solutions that can be mitigated by selecting an appropriate gap distance between the substrate and the dip coating vessel. The limitation of this approach resides in the fact that the coating vessel itself has to be adjusted for a given coating composition and a given coating wet thickness. In a production environment, the coating vessel is expensive and fixed, which limits flexibility for coating different products. There is a need to develop a method to deal with the sloping problem in a more general way that does not require modification to the coating vessel and is economical to practice.

P. Groenveld, "Thickness Distribution in Dip-Coating," *J. Paint Technology*, Vol. 43, No. 561, October 1971, the disclosure of which is incorporated herein by reference, discusses the varying thickness of a film on a vertical, flat plate being withdrawn from a bath of paint. FIG. 1 depicts the thickness distribution in dip coating of a theoretical endless plate compared with a plate of finite length. For the latter situation, draining of the dipped plate upon removal from the dip tank results in an, uneven parabolic thickness distribution of at least a portion of the plate. If no solidification of the coating occurs, the entire film will be of uneven thickness. In most situations however, the paint film solidifies during the withdrawal, for example, through evaporation. In that case, a distribution containing a portion of uniform thickness is obtained, as shown in FIG. 1.

The equation describing the Groenveld model is very complicated. However by analyzing the results supporting the model, the present inventor has deduced that the most important parameters controlling the dip coating process are the following: coating solution viscosity, coating substrate withdrawal speed, coating solution surface tension, and evaporation rate of the coating solution solvent. Three of these parameters can be combined, as shown in Equation 1 below, to yield a dimensionless capillary number Ca:

$$Ca=(mv)/S \qquad \text{(Equation 1)}$$

where v is the substrate withdrawal velocity in cm/sec, m, the dynamic viscosity of the coating solution in poise, and S the surface tension of the solution in dyne/cm.

As disclosed in the aforementioned co-pending, commonly assigned, U.S. Provisional Patent Application Ser. No. 60/533,124 filed on Dec. 24, 2003, an existing coating apparatus can be employed in a normal coating environment to carry out a series of tests that include variation of the aforementioned four key parameters (reduced to two when the capillary number is used), thereby producing a model that defines the coating process and enables control of the sloping problem for metal substrates under normal temperature and humidity conditions. Although applicable to many coating situations, this model is difficult to apply to substrates that are thin or are formed from materials having low heat capacities, for example, most plastics. The method of the present invention enables application of the model to thin substrates, including those made from plastic.

SUMMARY OF THE INVENTION

The present invention is directed to a method for controlling the thickness and uniformity of a dip coated layer on a thin substrate using a coating apparatus under conditions of controlled temperature and controlled low humidity. The method comprises:

(a) under normal coating conditions of ambient temperature and relative humidity, forming on a metal substrate having a thickness of at least about 500 microns a series of coated layers containing variations in coating solution viscosity m, coating substrate withdrawal speed v, capillary number Ca, coating solution surface tension S, and boiling point bp (a correlative of evaporation rate) of the coating solution solvent, a coated layer including at least a portion of uniform thickness T(even) and, optionally, a portion of non-uniform thickness L(uneven);

(b) statistically analyzing measurements carried out on the series of coated layers and generating the constants, a, b, c, d, and e for the following Equations 2, 3, and 4:

(i) Equation 2, which predicts the thickness T(even), in cm, of the portion of the coated layer having uniform thickness $$T(\text{even})=a+b(m*v) \quad \text{(Equation 2)}$$

where a and b are constants, m is the dynamic viscosity, in poise, of the coating solution, and v is the substrate withdrawal speed in cm/sec, (ii) Equation 3, which predicts the length, in cm, of a sloping portion L(uneven) of the coated layer having non-uniform thickness $$L(\text{uneven})=c+d*(v*bp)+e*(Ca*bp) \quad \text{(Equation 3)}$$

where c, d, and e are constants, v the substrate withdrawal speed in cm/sec, bp is the boiling point of the coating solvent in ° C., and Ca is the capillary number, (iii) Equation 4, which predicts the substrate withdrawal coating speed v(even), in cm/sec, required for the maximum thickness of a coated layer having a completely uniform thickness, i.e., L(uneven)=0:

$$v(\text{even})=-c/bp*(d+e*m/S) \quad \text{(Equation 4)}$$

where c, d, and e are constants, bp is the boiling point in ° C. of the coating solvent, m is the dynamic viscosity, in poise, of the coating solution, and S is the surface tension, in dyne/cm, of the coating solution;

(c) using Equation 4, determining the coating speed v(even) producing the maximum thickness of a coated layer having a completely uniform thickness for a given set of coating solution characteristics, the coated layer being formed on a thin substrate under coating conditions of controlled temperature and controlled low humidity; and (d) using Equation 2, determining the thickness T(even) of the portion of the coated layer having uniform thickness for a given set of coating solution characteristics and the coating speed determined in step (c), the coated layer being formed on a thin substrate under coating conditions of controlled temperature and controlled low humidity.

DETAILED DESCRIPTION OF THE INVENTION

Figure 1:
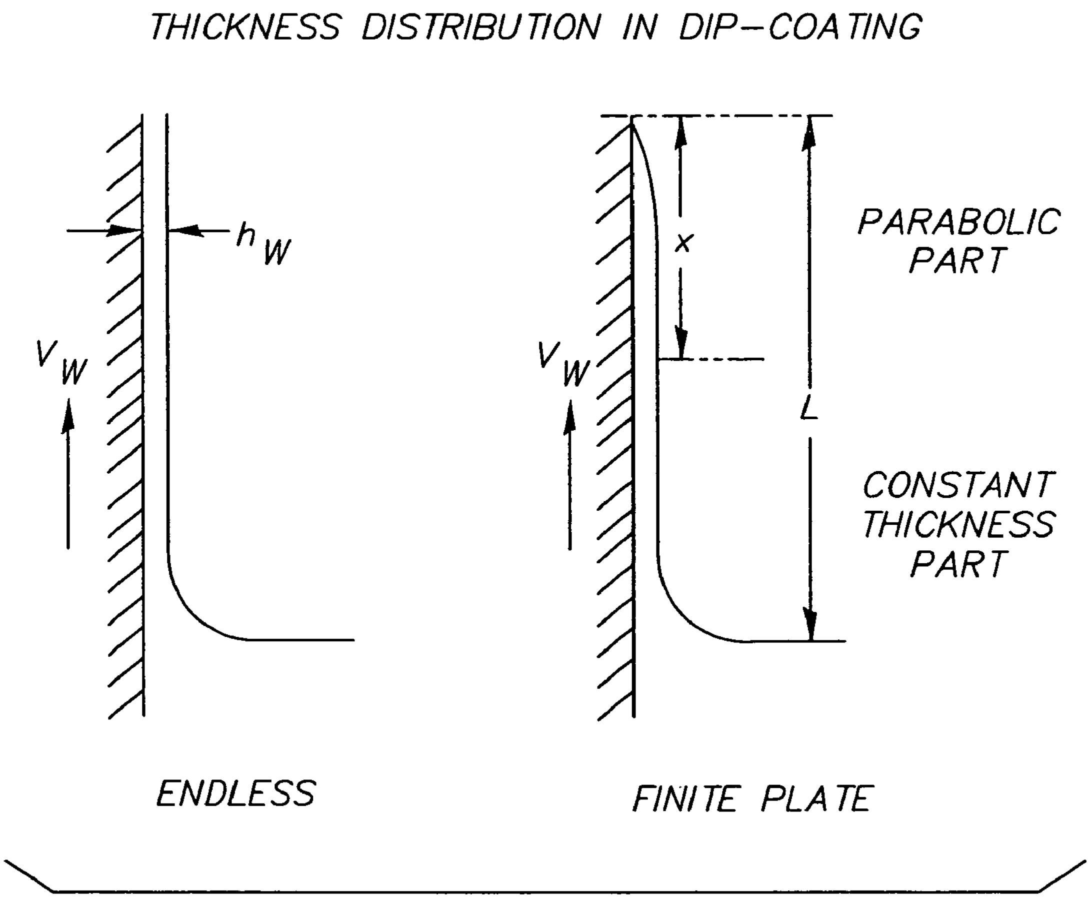
FIG. 1 is a schematic illustration of the thickness distribution in dip coating of a theoretical endless plate compared with a plate of finite length.

The coating equations developed using a relatively thick substrate such as a conventional aluminum drum cannot be applied to thin substrates under normal coating conditions of ambient temperature and relative humidity. A thick substrate has sufficient stored heat to prevent the coated layer from falling below the dew point. However, for a thin substrate, that is, one having a thickness of less than about 500 microns, it is much more difficult to dry the coated layer in a normal coating environment. When the coated layer approaches the dew point, drying is substantially retarded, and the sloping problem is more pronounced.

It has now unexpectedly been found that by lowering the relative humidity substantially, preferably below about 20% R.H., more preferably, from about 5% R.H. to about 10% R.H., and controlling the temperature of the coating booth to a range from about 20° C. to about 25° C., thereby lowering the dew point, it is possible to apply the equations developed for the relatively thick substrate without modification to a substrate, which is preferably in the form of a tubular sleeve.

The present invention is useful for controlling the thickness and uniformity of a layer such as a charge transport layer or a charge generation layer that is applied by dip coating to the surface of a thin photoconductor substrate. The thin substrate, which preferably has a thickness of less than about 500 microns, more preferably, of about 10 microns to about 200 microns, is preferably formed from nickel, aluminum, steel, or a plastic, more preferably, nickel.

The method of the present invention is useful for the preparation of coated layers whose portions of uniform thickness have thicknesses of, preferably, about 5 μm to about 60 μm, more preferably, about 10 μm to about 40 μm, even more preferably, about 15 μm to about 30 μm.

Having a dip coating of completely uniform thickness across the entire surface of a coated substrate is frequently unnecessary. In many photoconductor applications, for example, the image area is centered in the middle of the photoconductor, with a fraction of the photoconductor length along each edge unused for imaging. Because, as shown in FIG. 1, the thickness of the coated layer at the upper edge of the drum has an uneven parabolic profile. Using Equation 3, the substrate withdrawal coating speed necessary to obtain a coating having a given sloping portion of non-uniform thickness that lies outside the imaging area can be determined. That coating speed will be faster than v(even) for a given set of coating solution characteristics, enabling a more rapid, economical coating procedure.

Using a dip coating apparatus built by Toray Engineering of Japan, aluminum drum substrates having a pre-coated charge generation and barrier layer with a combined total thickness of less than about 5 μm were dip coated with several charge transport layer coating solutions containing various organic solvents. At least a portion of the coatings solidified during the substrate withdrawal time.

The solvent systems employed in these coating solutions are listed in TABLE 1 following:

TABLE 1

| Solvent System | Solvent | Solvent bp (° C.) | Surfactant | Solution Surface Tension (dynes/cm$^2$) |
|---|---|---|---|---|
| 1 | toluene | 109 | DC-510 | 26.8 |
| 2 | tetrahydrofuran (THF) | 66 | DC-510 | 26.1 |
| 3 | tetrahydrofuran (THF) | 66 | FC-431 | 22.8 |
| 4 | tetrahydrofuran (THF) | 66 | none | 26.6 |
| 5 | dichloromethane (DCM) | 35 | DC-510 | 26.5 |

Using each of the solvent systems included in TABLE 1, charge transport layer (CTL) coating solutions were prepared from a mixture of 60 wt. % of a polyester binder formed from 4,4'-(2-norbornylidene)diphenol and a 40/60 molar ratio of terephthalic/azelaic acids, and 40 wt. % of the charge transfer agent 1,1-bis{di-4-tolylamino)phenyl}cyclohexane. The solids content in each was adjusted to yield a viscosity series and corresponding capillary series, and the coating speed were determined for each member of the he results are presented in TABLE 2 following:

TABLE 2

| | | Capillary Number Ca | | | | |
|---|---|---|---|---|---|---|
| Viscosity m (Cps) | Withdrawal Speed (cm/sec) | Solvent System 1 Toluene-DC510 | Solvent System 2 THF-DC510 | Solvent System 3 THF-FC431 | Solvent System 4 THF | Solvent System 5 DCM-DC510 |
| 600 | 0.09 | 0.0201 | 0.0207 | 0.0237 | 0.0203 | 0.0208 |
| 600 | 0.18 | 0.0403 | 0.0414 | 0.0474 | 0.0406 | 0.0415 |
| 600 | 0.26 | 0.0582 | 0.0598 | 0.0684 | 0.0586 | 0.0600 |
| 600 | 0.79 | 0.1769 | 0.1816 | 0.2079 | 0.1782 | 0.1823 |
| 400 | 0.13 | 0.0194 | 0.0199 | 0.0228 | 0.0195 | 0.0200 |
| 400 | 0.26 | 0.0388 | 0.0398 | 0.0456 | 0.0391 | 0.0400 |
| 400 | 0.39 | 0.0582 | 0.0598 | 0.0684 | 0.0586 | 0.0600 |
| 400 | 0.52 | 0.0776 | 0.0797 | 0.0912 | 0.0782 | 0.0800 |
| 300 | 0.18 | 0.0201 | 0.0207 | 0.0237 | 0.0203 | 0.0208 |
| 300 | 0.35 | 0.0392 | 0.0402 | 0.0461 | 0.0395 | 0.0404 |
| 300 | 0.52 | 0.0582 | 0.0598 | 0.0684 | 0.0586 | 0.0600 |
| 300 | 0.69 | 0.0772 | 0.0793 | 0.0908 | 0.0778 | 0.0796 |
| 150 | 0.35 | 0.0196 | 0.0201 | 0.0230 | 0.0197 | 0.0202 |
| 150 | 0.69 | 0.0386 | 0.0397 | 0.0454 | 0.0389 | 0.0398 |
| 150 | 1.03 | 0.0576 | 0.0592 | 0.0678 | 0.0581 | 0.0594 |
| 150 | 1.38 | 0.0772 | 0.0793 | 0.0908 | 0.0778 | 0.0796 |

From the results of the experiments, as described above and summarized in TABLE 2 for the various solvent systems, the following values were determined by statistical analysis for the constants for the charge transport layer coating equations:

a=0.001169; b=0.001423; c=−2.0293; d=0.1262; e=0.7988

Accordingly, $$T(\text{even})=0.001169+0.001423*(m*v) \qquad \text{Equation 2}$$

(Statistics: F value=847; Rsquare=0.98; T value for intercept=20.2; T value for m*v=40.9)

$$L(\text{uneven})=-2.0293+0.1262*(v*bp)+0.7988*(Ca*bp) \qquad \text{Equation 3}$$

(Statistics: F value=693; Rsquare=0.98; T value for intercept=−6.84; T value for v*bp=17.7; T value for Ca*bp=7.7)

Equation 4, derived from Equations 2 and 3 where L(uneven)=0:

$$v(\text{even})=2.0293/bp*(0.1262+0.7988*m/S)$$

Equation 4 can be used to calculate the substrate withdrawal coating speeds required to produce the thickest possible coating of completely uniform thickness for a given set of coating solution properties. Once the withdrawal speeds have been calculated, Equation 2 can be used to calculate the maximum thickness of a layer with complete profile uniformity that can be coated from a given coating solution.

EXAMPLE 1

Coatings of Charge Transport Layer Using Toluene-DC 510 Solvent System

Equation 4 was used to calculate the substrate withdrawal coating speed required to produce the thickest possible coating of completely uniform thickness using Solvent System 1, toluene containing DC-510 surfactant. Once the withdrawal speeds were calculated, Equation 2 was used to calculate the thickest layer with complete profile uniformity that could be coated. The results are shown in TABLE 3 following:

TABLE 3

| Viscosity m (Cps) | Coating Speed v(even) (cm/sec) | Maximum Uniform Layer Thickness (µm) |
|---|---|---|
| 100 | 0.118 | 13.4 |
| 200 | 0.099 | 14.5 |
| 300 | 0.085 | 15.3 |
| 400 | 0.074 | 15.9 |
| 500 | 0.066 | 16.4 |
| 600 | 0.060 | 16.8 |
| 700 | 0.054 | 17.1 |
| 800 | 0.050 | 17.4 |
| 900 | 0.046 | 17.6 |
| 1000 | 0.043 | 17.8 |

EXAMPLE 2

Coatings of Charge Transport Layer Using Tetrahydrofuran-DC 510 Solvent System The same procedure as described in Example 1 was used for Solvent System 2, tetrahydrofuran containing DC-510 surfactant. The results are shown in TABLE 4 following:

TABLE 4

| Viscosity m (Cps) | Coating Speed v(even) (cm/sec) | Maximum Uniform Layer Thickness (µm) |
|---|---|---|
| 100 | 0.196 | 14.5 |
| 200 | 0.163 | 16.3 |
| 300 | 0.140 | 17.7 |
| 400 | 0.123 | 18.7 |
| 500 | 0.109 | 19.5 |
| 600 | 0.098 | 20.1 |
| 700 | 0.090 | 20.6 |
| 800 | 0.082 | 21.0 |
| 900 | 0.076 | 21.4 |
| 1000 | 0.070 | 21.7 |

EXAMPLE 3

Coatings of Charge Transport Layer Using Dichloromethane-DC 510 Solvent System

The same procedure as described in Example 1 was used for Solvent System 2, dichloromethane containing DC-5 10 surfactant. The results are shown in TABLE 5 following:

TABLE 5

| Viscosity m (Cps) | Coating Speed v(even) (cm/sec) | Maximum Uniform Layer Thickness (μm) |
|---|---|---|
| 100 | 0.369 | 16.9 |
| 200 | 0.308 | 20.5 |
| 300 | 0.265 | 23.0 |
| 400 | 0.232 | 24.9 |
| 500 | 0.206 | 26.4 |
| 600 | 0.186 | 27.5 |
| 700 | 0.169 | 28.5 |
| 800 | 0.155 | 29.3 |
| 900 | 0.143 | 30.0 |
| 1000 | 0.133 | 30.6 |

EXAMPLE 4

Controlled Non-Uniform Coatings of Charge Transport Layer Using Tetrahydrofuran-DC 510, Solvent System The same procedure as described in Example 2 was used, but the calculations were made for thickness profiles in which the first 20 cm of the coatings are non-uniform, i.e., sloping. The results are shown in TABLE 6 following:

TABLE 6

| Viscosity m (Cps) | Coating Speed (cm/sec) | Layer Thickness (μm) |
|---|---|---|
| 100 | 0.384 | 17.1 |
| 200 | 0.320 | 20.8 |
| 300 | 0.275 | 23.4 |
| 400 | 0.241 | 25.4 |
| 500 | 0.214 | 26.9 |
| 600 | 0.193 | 28.2 |
| 700 | 0.176 | 29.2 |
| 800 | 0.161 | 30.0 |
| 900 | 0.149 | 30.7 |
| 1000 | 0.138 | 31.4 |

EXAMPLE 5

Controlled Non-Uniform Coatings of Charge Transport Layer Using Dichloromethane-DC 510 Solvent System The same procedure as described in Example 3 was used, but the calculations were made for thickness profiles in which the first 20 cm of the coatings are non-uniform, i.e., sloping. The results are shown TABLE 7 following:

TABLE 7

| Viscosity m (Cps) | Coating Speed (cm/sec) | Layer Thickness (μm) |
|---|---|---|
| 100 | 0.723 | 22.0 |
| 200 | 0.604 | 28.9 |
| 300 | 0.519 | 33.8 |
| 400 | 0.454 | 37.6 |
| 500 | 0.404 | 40.5 |
| 600 | 0.364 | 42.8 |
| 700 | 0.331 | 44.7 |
| 800 | 0.304 | 46.3 |
| 900 | 0.281 | 47.6 |
| 1000 | 0.261 | 48.8 |

From the results presented above, it can be seen that lower boiling solvents such as dichloromethane, which result in faster drying of the coatings under normal coating conditions, are preferred because they enable faster substrate withdrawal rates, i.e., coating speeds, and thicker uniform coatings.

In addition to the solvents employed in the illustrative examples, other solvents, for example, ketones such as acetone or methyl ethyl ketone and esters such as methyl acetate or ethyl acetate, alcohols such as methanol, ethanol, and mixtures of such solvents may be employed in the preparation of the coating solutions.

The invention has been described above with particular reference to preferred embodiments thereof, but it will be understood that variations and modifications can be effected within the spirit and scope of the invention, which is defined by the claims that follow.

What is claimed is:

1. A method for controlling the thickness and uniformity of a dip coated layer using a coating apparatus under conditions of controlled temperature and controlled low humidity, said method comprising:

(a) under normal coating conditions of ambient temperature and relative humidity, forming on a metal substrate having a thickness of at least about 500 microns a series of coated layers, using variations in coating solution viscosity m, coating substrate withdrawal speed v, coating solution surface tension S, and boiling point bp of coating solution solvent, at least a portion T(even) of a coated layer being of uniform thickness and, optionally, a portion L(uneven) of said coated layer being of non-uniform thickness;

(b) statistically analyzing measurements carried out on said series of coated layers and generating the constants, a, b, c, d, and e for the following Equations 2, 3, and 4:

(i) Equation 2, which predicts the thickness T(even), in cm, of the portion of the coated layer having uniform thickness $$T(\text{even})=a+b(m*v) \quad \text{(Equation 2)}$$

where a and b are constants, m is the dynamic viscosity, in poise, of the coating solution, and v is the substrate withdrawal speed in cm/sec, (ii) Equation 3, which predicts the length L(uneven), in cm, of a sloping portion of the coated layer having non-uniform thickness $$L(\text{uneven})=c+d*(v*bp)+e*(Ca*bp) \quad \text{(Equation 3)}$$

where c, d, and e are constants, v the substrate withdrawal speed in cm/sec, bp is the boiling point of the coating solvent in ° C., and Ca is the capillary number, (iii) Equation 4, which predicts the substrate withdrawal coating speed v(even), in cm/sec, required for the maximum thickness of a coated layer having a completely uniform thickness, which occurs when L(uneven)=0:

$$v(\text{even})=-c/(bp*(d+e*m/S)) \quad \text{(Equation 4)}$$

where c, d, and e are constants, bp is the boiling point in ° C. of the coating solvent, m is the dynamic viscosity, in poise, of the coating solution, and S is the surface tension, in dyne/cm, of the coating solution;

(c) using Equation 4, determining the coating speed v(even) producing the maximum thickness of a coated layer having completely uniform thickness for a given set of coating solution characteristics, said coated layer being formed on a thin substrate under coating conditions of controlled temperature and controlled low humidity; and (d) using Equation 2, determining the thickness T(even) of the portion of a coated layer having uniform thickness for a given set of coating solution characteristics and the coating speed determined in step (c), said coated layer being formed on a thin substrate under coating conditions of controlled temperature and controlled low humidity; and (e) using the v(even) and T(even) values determined in (c) and (d) to control the thickness and uniformity of a dip coated layer on a thin substrate using a coating apparatus under conditions of controlled temperature and controlled low humidity.

2. The method of claim 1 wherein said thin substrate has a thickness of less than about 500 microns.

3. The method of claim 2 wherein said thin substrate has a thickness of about 10 microns to about 200 microns.

4. The method of claim 1 wherein said thin substrate is formed from a metal.

5. The method of claim 4 wherein said metal is selected from the group consisting of nickel, aluminum, and steel.

6. The method of claim 5 wherein said metal is nickel.

7. The method of claim 1 wherein said thin substrate is formed from a plastic.

8. The method of claim 1 wherein said thin substrate is a tubular sleeve.

9. The method of claim 1 wherein said controlled temperature is from about 20° C. to about 25° C.

10. The method of claim 1 wherein said controlled humidity is below about 20% R.H.

11. The method of claim 10 wherein said controlled humidity is from about 5% R.H. to about 10% R.H.

12. The method of claim 1 wherein the portion of the coated layer of uniform thickness has a thickness of about 5 μm to about 60 μm.

13. The method of claim 12 wherein the portion of the coated layer of uniform thickness has a thickness of about 10 μm to about 40 μm.

14. The method of claim 13 wherein the portion of the coated layer of uniform thickness has a thickness of about 15 μm to about 30 μm.

15. The method of claim 1 wherein the coated layer includes a controlled portion of non-uniform thickness.

16. The method of claim 1 wherein the coated layer comprises a charge transport agent.

17. The method of claim 1 wherein the coated layer comprises a charge generation agent.

18. The method of claim 1 wherein the coating solution solvent is selected from the group consisting of toluene, tetrahydrofuran, methylene chloride, acetone, methyl ethyl ketone, methyl acetate, ethyl acetate, and mixtures thereof.

19. The method of claim 17 wherein the coating solution solvent is dichloromethane.

20. The method of claim 1 wherein the coating solution solvent has a boiling point below about 100° C.

21. The method of claim 20 wherein the coating solution solvent has a boiling point below about 60° C.

22. The method of claim 21 wherein the coating solution solvent has a boiling point below about 40° C.

* * * * *